United States Patent [19]

Merchant

[11] Patent Number: 5,064,560

[45] Date of Patent: Nov. 12, 1991

[54] TERNARY AZEOTROPIC COMPOSITIONS OF 43-10MEE ($CF_3CHFCHFCH_2CF_3$) AND TRANS 1,2-DICHLOROETHYLENE WITH METHANOL OR ETHANOL

[75] Inventor: Abid N. Merchant, Wilmington, Del.

[73] Assignee: E. I. Du Pont de Nemours and Company, Wilmington, Del.

[21] Appl. No.: 595,834

[22] Filed: Oct. 11, 1990

[51] Int. Cl.$^5$ .................. C23G 5/028; C09K 5/04; C09K 3/30; C11D 7/30

[52] U.S. Cl. ........................ 252/171; 252/67; 252/69; 252/162; 252/170; 252/172; 252/305; 252/364; 252/DIG. 9; 134/12; 134/31; 134/38; 134/39; 134/40; 521/98; 521/131; 62/114

[58] Field of Search .................. 252/67, 69, 162, 170, 252/171, 172, 305, 364, DIG. 9; 134/12, 31, 38, 39, 40; 521/98, 131; 62/114

Primary Examiner—Paul Lieberman
Assistant Examiner—Bradley A. Swope
Attorney, Agent, or Firm—James E. Shipley

[57] ABSTRACT

Azeotropic mixtures of 1,1,1,2,3,4,4,5,5,5-decafluoropentane and trans 1,2-dichloroethylene with methanl or ethanol, the azeotropic mixtures being useful in solvent cleaning applications.

15 Claims, No Drawings

TERNARY AZEOTROPIC COMPOSITIONS OF 43-10MEE (CF₃CHFCHFCH₂CF₃) AND TRANS 1,2-DICHLOROETHYLENE WITH METHANOL OR ETHANOL

INVENTION BACKGROUND

As modern electronic circuit boards evolve toward increased circuit and component densities, thorough board cleaning after soldering becomes a more important criterion. Current industrial processes for soldering electronic components to circuit boards involve coating the entire circuit side of the board with flux and thereafter passing the flux-coated board over preheaters and through molten solder. The flux cleans the conductive metal parts and promotes solder fusion. Commonly used solder fluxes generally consist of rosin, either used alone or with activating additives, such as amine hydrochlorides or oxalic acid derivatives.

After soldering, which thermally degrades part of the rosin, the flux-residues are often removed from the circuit boards with an organic solvent. The requirements for such solvents are very stringent. Defluxing solvents should have the following characteristics: a low boiling point, be nonflammable, have low toxicity and high solvency power, so that flux and flux-residues can be removed without damaging the substrate being cleaned.

While boiling point, flammability and solvent power characteristics can often be adjusted by preparing solvent mixtures, these mixtures are often unsatisfactory because they fractionate to an undesirable degree during use. Such solvent mixtures also fractionate during solvent distillation, which makes it virtually impossible to recover a solvent mixture with the original composition.

On the other hand, azeotropic mixtures, with their constant boiling points and constant compositions, have been found to be very useful for these applications. Azeotropic mixtures exhibit either a maximum or minimum boiling point and they do not fractionate on boiling. These characteristics are also important when using solvent compositions to remove solder fluxes and flux-residues from printed circuit boards. Preferential evaporation of the more volatile solvent mixture components would occur if the mixtures were not azeotropic and would result in mixtures with changed compositions, and with attendant less-desirable solvency properties, such as lower rosin flux solvency and lower inertness toward the electrical components being cleaned. The azeotropic character is also desirable in vapor degreasing operations, where redistilled solvent is generally employed for final rinse cleaning. In summary, vapor defluxing and degreasing systems act as a still. Unless the solvent composition exhibits a constant boiling point, i.e., is an azeotrope fractionation will occur and undesirable solvent distributions will result, which could detrimentally affect the safety and efficacy of the cleaning operation.

A number of chlorofluorocarbon based azeotropic compositions have been discovered and in some cases used as solvents for solder flux and flux-residue removal from printed circuit boards and also for miscellaneous degreasing applications. For example: U.S. Pat. No. 3,903,009 discloses the ternary azeotrope of 1,1,2-trichlorotrifluoroethane with ethanol and nitromethane; U.S. Pat. No. 2,999,815 discloses the binary azeotrope of 1,1,2-trichlorotrifluoroethane and acetone; U.S. Pat. No. 2,999,817 discloses the binary azeotrope of 1,1,2-trichlorotrifluoroethane and methylene chloride.

Such mixtures are also useful as buffing abrasive detergents, e.g., to remove buffing abrasive compounds from polished surfaces such as metal, as drying agents for jewelry or metal parts, as resist-developers in conventional circuit manufacturing techniques employing chlorine-type developing agents, and to strip photoresists (for example, with the addition of a chlorohydrocarbon such as 1,1,1-trichloroethane or trichloroethylene). The mixtures are further useful as refrigerants, heat transfer media, gaseous dielectrics, foam expansion agents, aerosol propellants, solvents and power cycle working fluids.

Closed-cell polyurethane foams are widely used for insulation purposes in building construction and in the manufacture of energy efficient electrical appliances. In the construction industry, polyurethane (polyisocyanurate) board stock is used in roofing and siding for its insulation and load-carrying capabilities. Poured and sprayed polyurethane foams are also used in construction. Sprayed polyurethane foams are widely used for insulating large structures such as storage tanks, etc. Pour-in-place polyurethane foams are used, for example, in appliances such as refrigerators and freezers plus they are used in making refrigerated trucks and railcars.

All of these various types of polyrethane foams require expansion agents (blowing agents) for their manufacture. Insulating foams depend on the use of halocarbon blowing agents, not only to foam the polymer, but primarily for their low vapor thermal conductivity, a very important characteristic for insulation value. Historically, polyurethane foams are made with CFC-11 (CFCl₃) as the primary blowing agent.

A second important type of insulating foam is phenolic foam. These foams, which have very attractive flammability characteristics, are generally made with CFC-11 and CFC-113 (1,1,2-trichloro-1,2,2-trifluoroethane) blowing agents.

A third type of insulating foam is thermoplastic foam, primarily polystyrene foam. Polyolefin foams (polyethylene and polypropylene) are widely used in packaging. These thermoplastic foams are generally made with CFC-12.

Many smaller scale hermetically sealed, refrigeration systems, such as those used in refrigerators or window and auto air conditioners, use dichlorodifluoromethane (CFC-12) as the refrigerant. Larger scale centrifugal refrigeration equipment, such as those used for industrial scale cooling, e.g., commercial office buildings, generally employ trichlorofluoromethane (CFC-11) or 1,1,2-trichlorotrifluoroethane (CFC-113) as the refrigerants of choice. Azeotropic mixtures, with their constant boiling points and compositions have also been found to be very useful as substitute refrigerants, for many of these applications.

Aerosol products have employed both individual halocarbons and halocarbon blends as propellant vapor pressure attenuators, in aerosol systems. Azeotropic mixtures, with their constant compositions and vapor pressures would be very useful as solvents and propellants in aerosol systems.

Some of the chlorofluorocarbons which are currently used for cleaning and other applications have been theoretically linked to depletion of the earth's ozone layer. As early as the mid-1970's, it was known that introduction of hydrogen into the chemical structure of previously fully-halogenated chlorofluorocarbons reduced the chemical stability of these compounds. Hence, these now destabilized compounds would be expected to degrade in the lower atmosphere and not reach the stratospheric ozone layer intact. What is also needed, therefore, are substitute chlorofluorocarbons which have low theoretical ozone depletion potentials.

Unfortunately, as recognized in the art, it is not possible to predict the formation of azeotropes. This fact obviously complicates the search for new azeotropic compositions, which have application in the field. Nevertheless, there is a constant effort in the art to discover new azeotropic compositions, which have desirable solvency characteristics and particularly greater versatilities in solvency power.

INVENTION SUMMARY

According to the present invention, azeotropic compositions have been discovered comprising admixtures of 1,1,1,2,3,4,4,5,5,5-decafluoropentane effective amounts of (43-10 mee) and trans 1,2-dichloroethylene with an alcohol from the group consisting of methanol or ethanol. More specifically, the azeotropic mixtures are: an admixture of about 55-65 weight percent 43-10 mee and about 32.5-40 weight percent trans 1,2-dichloroethylene and about 2.5-5 weight percent methanol; and an admixture of about 59-67 weight percent 43-10 mee and about 31.5-38 weight percent trans 1,2-dichloroethylene and about 0.5-3 weight percent ethanol.

The preparation of 1,1,1,2,3,4,4,5,5,5-decafluoropentane from an unsaturated intermediate is disclosed in CR-8898, filed on even date herewith by C. G. Krespan and V. N. M. Rao. The preparation of the unsaturated intermediate is disclosed in CR-8897, filed on even date herewith by C. G. Krespan. The disclosures of both of these applications are hereby incorporated by reference.

The present invention provides nonflammable azeotropic compositions which are well suited for solvent cleaning applications.

The compositions of the invention can further be used as refrigerants in existing refrigeration equipment, e.g., designed to use CFC-12 or F-11. They are useful in compression cycle applications including air conditioner and heat pump systems for producing both cooling and heating. The new refrigerant mixtures can be used in refrigeration applications such as described in U.S. Pat. No. 4,482,465 to Gray.

DETAILED DESCRIPTION OF THE INVENTION

The compositions of the instant invention comprise admixture of effective amounts of 43-10 mee ($CF_3CHFCHFCF_2CF_3$, boiling point=50° C.) and trans 1,2-dichloroethylene ($CHCl=CHCl$, boiling point=48° C.) with an alcohol selected from the group consisting of methanol ($CH_3OH$, boiling point=64.6° C.) or ethanol ($CH_3CH_2OH$, boiling point=78.4° C.) to form an azeotropic composition.

By azeotropic composition is meant a constant boiling liquid admixture of three or more substances, whose admixture behaves as a single substance, in that the vapor, produced by partial evaporation or distillation of the liquid has the same composition as the liquid, i.e., the admixture distills without substantial composition change. Constant boiling compositions, which are characterized as azeotropic, exhibit either a maximum or minimum boiling point, as compared with that of the nonazeotropic mixtures of the same substances.

By effective amount is meant the amount of each component of the instant invention admixture, which when combined, results in the formation of the azeotropic composition of the instant invention.

The language "an azeotropic composition consisting essentially of . . . " is intended to include mixtures which contain all the components of the azeotrope of this invention (in any amounts) and which, if fractionally distilled, would produce an azeotrope containing all the components of this invention in at least one fraction, alone or in combination with another compounds, e.g., one distills at substantially the same temperature as said fraction and does not significantly affect the azeotropic character of the composition. It is possible to characterize, in effect, a constant boiling admixture, which may appear under many guises, depending upon the conditions chosen, by any of several criteria:

The composition can be defined as an azeotrope of A, B and C, since the very term "azeotrope" is at once both definitive and limitative, and requires that effective amounts A, B and C form this unique composition of matter, which is a constant boiling admixture.

It is well known by those skilled in the art that at different pressures, the composition of a given azeotrope will vary—at least to some degree—and changes in pressure will also change—at least to some degree—the boiling point temperature. Thus an azeotrope of A, B and C represents a unique type of relationship but with a variable composition which depends on temperature and/or pressure. Therefore compositional ranges, rather than fixed compositions, are often used to define azeotropes.

The composition can be defined as a particular weight percent relationship or mole percent relationship of A, B and C, while recognizing that such specific values point out only one particular such relationship and that in actuality, a series of such relationships, represented by A, B and C actually exist for a given azeotrope, varied by the influence of pressure.

Azeotrope A, B and C can be characterized by defining the composition as an azeotrope characterized by a boiling point at a given pressure, thus giving identifying characteristics without unduly limiting the scope of the invention by a specific numerical composition, which is limited by and is only as accurate as the analytical equipment available.

Ternary mixtures of 55-65 (preferably 58-64) weight percent 43-10 mee and 32.5-40 (preferably 34-38) weight percent trans 1,2-dichloroethylene and 2.5-5 (preferably 3-4) weight percent methanol are characterized as azeotropic, in that mixtures within this range exhibit a substantially constant boiling point at constant pressure. Being substantially constant boiling, the mixtures do not tend to fractionate to any great extent upon evaporation.

After evaporation, only a small difference exists between the composition of the vapor and the composition of the initial liquid phase. This difference is such that the compositions of the vapor and liquid phases are considered substantially identical.

Accordingly, any mixture within this range exhibits properties which are characteristic of a true ternary azeotrope. The ternary composition consisting of about 60.5 weight percent 43-10 mee, and about 36.2 weight percent trans 1,2-dichloroethylene and about 3.3 weight percent methanol has been established, within the accuracy of the fractional distillation method, as a true ternary azeotrope, boiling at about 35.3° C., at substantially atmospheric pressure.

Also according to the instant invention, ternary mixtures of 59-67 (preferably 61-66) weight percent 43-10 mee and 31.5-38 (preferably 33.5-37) weight percent trans 1,2-dichloroethylene and 0.5-3 (preferably 0.5-2) weight percent ethanol are characterized as azeotropic, in that mixtures within this range exhibit a substantially constant boiling point at constant pressure. Being substantially constant boiling, the mixtures do not tend to fractionate to any great extent upon evaporation.

After evaporation, only a small difference exists between the composition of the vapor and the compostion of the initial liquid phase. This difference is such that the compositions of the vapor and liquid phases are considered substantially identical.

Accordingly, any mixture within this range exhibits properties which are characteristic of a true ternary azeotrope. The ternary composition consisting of about 64 weight percent 43-10 mee, and about 35 weight percent trans 1,2-dichloroethylene and about 1 weight percent ethanol has been established, within the accuracy of the fractional distillation method, as a true ternary azeotrope, boiling at about 35.1° C., at substantially.

The aforestated azeotropes have low ozone-depletion potentials and are expected to decompose almost completely, prior to reaching the stratosphere.

The azeotropic compositions of the instant invention permit easy recovery and reuse of the solvent from vapor defluxing and degreasing operations because of their azeotropic natures. As an example, the azeotropic mixtures of this invention can be used in cleaning processes such as described in U.S. Pat. No. 3,881,949, or as a buffing abrasive detergent.

In addition, the mixtures are useful as resist developers, where chlorine-type developers would be used, and as resist stripping agents with the addition of appropriate halocarbons.

Another aspect of the invention is a refrigeration method which comprises condensing a refrigerant composition of the invention and thereafter evaporating it in the vicinity of a body to be cooled. Similarly, still another aspect of the invention is a method for heating which comprises condensing the invention refrigerant in the vicinity of a body to be heated and thereafter evaporating the refrigerant.

A further aspect of the invention includes aerosol compositions comprising an active agent and a propellant, wherein the propellant is an azeotropic mixture of the invention; and the production of these compositions by combining said ingredients. The invention further comprises cleaning solvent compositions comprising the azeotropic mixtures of the invention.

The azeotropic compositions of the instant invention can be prepared by any convenient method including mixing or combining the desired component amounts. A preferred method is to weigh the desired component amounts and thereafter combine them in an appropriate container.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The 1,1,1,2,3,4,4,5,5,5-decafluoropentane of this invention may be prepared by starting with materials described in U.S. patent application Ser. No. 07/595,839 which is hereby incorporated by reference in its entirely. According to the teachings therein, polyfluoroolefins having at least 5 carbon atoms may be manufactured by reacting together two selected polyfluoroolefins in the presence of a catalyst of the formula $AlX_3$ where X is one or more of F, Cl or Br (provided that X is not entirely F). As exemplified by Example 4 herein, a five carbon perfluoroolefinic starting material may be prepared by the reaction of hexafluoropropene (HFP) with tetrafluoroethylene (TFE). A six carbon perfluoro-olefinic starting material may be prepared by the reaction, substantially according to the procedure of Example 4, of 1,1,1,4,4,4-hexafluoro-2,3-dichloro-2-butene with TFE to yield an intermediate product comprising perfluoro-2,3-dichloro-2-hexene which may then be converted to perfluoro-2-hexene by reaction with potassium fluoride in refluxing N-methyl pyrolidone. A mixture of seven carbon perfluoroolefinic starting materials may be prepared by the reaction, substantially according to the procedure of Example 4, of hexafluoro-propene with 2 moles of TFE.

The $CF_3CHFCHFCF_2CF_3$ of this invention may be prepared by a process which comprises the step of reacting an olefinic starting material prepared or described above in the vapor phase with hydrogen over a metal catalyst from the palladium group. The olefinic starting material for this process has the same number of carbon atoms as the desired dihydropolyfluoroalkanes and may be $CF_3CF=CFCF_2CF_3$, and has its olefinic bond between the carbon atoms which correspond to the carbons which bear the hydrogen in said dihydropolyfluoroalkane.

Unsupported metal catalysts and supported metal catalysts wherein the metal is palladium, rhodium, or ruthenium are suitable for use in this process. supports such as carbon or alumina may be employed. Palladium on alumina is the preferred catalyst.

The vapor phase reduction can be carried out at temperatures in the range of from about 50° C. to about 225° C.; the preferred temperature range is from about 100° C. to about 200° C. The pressure of the hydrogenation may vary widely from less than 1 atmosphere to 20 or more atmospheres. The molar ratio of hydrogen to olefinic starting material for this process is preferably between about 0.5:1 and 4:1, and is more preferably between about 0.5:1 and 1.5:1.

Processes for the preparation of $CF_3CHFCHFCF_2CF_3$ are exemplified in Examples 5 and 6 herein.

The entire disclosure of all applications, patents and publications, cited above and below, are hereby incorporated by reference.

EXAMPLE 1

A solution which contained 66.1 weight percent 1,1,1,2,3,4,4,5,5,5-decafluoropentane (43-10 mee), 30.9 weight percent trans 1,2-dichloroethylene and 3.0 weight percent methanol was prepared in a suitable container and mixed thoroughly.

The solution was distilled in a Perkin-Elmer Mode 251 Autoannular Spinning Band Still (200 plate fractionating capability), using a 20:1 reflux to take-off ratio. Head and pot temperatures were adjusted to 760 mm Hg pressure. Head temperatures were read directly to 0.1° C. Distillated compositions were determined by gas chromatography. Results obtained are summarized in Table 1.

TABLE 1

DISTILLATION OF:
(66.1 + 30.9 + 3.0)
43-10 mee (43-10)
TRANS 1,2-DICHLOROETHYLENE (TRANS), AND METHANOL (MEOH)

| CUTS | TEMP., °C. POT | TEMP., °C. HEAD | WT. % DISTILLED OR RECOVERED | WEIGHT PERCENTAGES 43-10 | WEIGHT PERCENTAGES TRANS | WEIGHT PERCENTAGES MEOH |
|---|---|---|---|---|---|---|
| 11 | 36.7 | 34.8 | 53.9 | 61.38 | 35.25 | 3.37 |
| 12 | 36.8 | 34.8 | 56.8 | 60.98 | 35.71 | 3.31 |
| 13 | 37.5 | 34.9 | 61.4 | 62.91 | 33.93 | 3.16 |
| 14 | 37.9 | 35.4 | 66.8 | 59.85 | 36.87 | 3.28 |
| 15 | 38.6 | 35.4 | 70.3 | 59.61 | 37.02 | 3.37 |
| 16 | 38.6 | 35.5 | 73.8 | 59.32 | 37.37 | 3.31 |
| 17 | 42.0 | 35.9 | 78.0 | 59.57 | 37.13 | 3.30 |
| 18 | 46.0 | 35.9 | 80.8 | 60.11 | 36.26 | 3.63 |
| HEEL | — | — | 87.1 | 96.27 | 2.27 | 1.46 |

Analysis of the above data indicates very small differences between head temperatures and distillate compositions, as the distillation progressed. A statistical analysis of the data indicates that the true ternary azeotrope of 43-10 mee, trans 1,2-dichloroethylene and methanol has the following characteristics at atmospheric pressure (99 percent confidence limits):
43-10 mee = 60.5 ± 4.1 wt. %
trans 1,2-dichlorethylene = 36.2 ± 3.9 wt. %
methanol = 3.3 ± 0.1 wt. %
Boiling point, ° C. = 35.3 ± 1.5

EXAMPLE 2

A solution which contained 64.7 weight percent (43-10 mee), 32.8 weight percent trans 1,2-dichloroethylene and 2.5 weight percent ethanol was prepared in a suitable container and mixed thoroughly.

The solution was distilled in a Perkin Elmer Mode 251 Autoannular Spinning Band Still (200 plate fractionating capability), using a 15:1 reflux ratio to take-off ratio. Head and pot temperatures were read directly to 0.1° C. All temperatures were adjusted to 760 mm pressure. Distillate compositions were determined by gas chromatography. Results obtained are summarized in Table 2.

TABLE 2

DISTILLATION OF:
(64.7 + 32.8 + 2.5)
43-10 mee (43-10),
TRANS 1,2-DICHLOROETHYLENE (TRANS) AND ETHANOL (ETOH)

| CUTS | TEMP., °C. POT | TEMP., °C. HEAD | WT. % DISTILLED OR RECOVERED | WEIGHT PERCENTAGES 43-10 | WEIGHT PERCENTAGES TRANS | WEIGHT PERCENTAGES ETOH |
|---|---|---|---|---|---|---|
| 1 | 37.9 | 35.0 | 10.9 | 64.58 | 34.45 | 0.97 |
| 2 | 37.9 | 35.0 | 16.0 | 64.06 | 34.91 | 1.03 |
| 3 | 37.9 | 35.0 | 19.4 | 63.81 | 35.14 | 1.05 |
| 4 | 38.0 | 35.1 | 24.3 | 63.74 | 35.22 | 1.04 |
| 5 | 38.2 | 35.0 | 29.4 | 65.08 | 33.85 | 1.07 |
| 6 | 38.3 | 35.0 | 35.4 | 64.28 | 34.76 | 0.96 |
| 7 | 38.5 | 35.1 | 47.9 | 63.94 | 35.07 | 0.99 |
| 8 | 38.6 | 35.1 | 53.9 | 63.42 | 35.61 | 0.97 |
| 9 | 38.8 | 35.1 | 61.7 | 63.50 | 35.57 | 0.93 |
| 10 | 39.0 | 35.2 | 72.0 | 63.08 | 35.91 | 1.01 |
| HEEL | — | — | — | 82.45 | 7.91 | 9.64 |

Analysis of the above data indicates very small differences between head temperatures and distillate compositions, as the distillation progressed. A statistical analysis of the data indicates that the true ternary azeotrope of 43-10 mee, trans 1,2-dichloroethylene and ethanol has the following characteristics at atmospheric pressure (99 percent confidence limits):
43-10 mee = 64.0 ± 1.9 wt. %
trans 1,2-dichloroethylene = 35.0 ± 1.9 wt. %
ethanol = 1.0 ± 0.2 wt. %
Boiling point, ° C. = 35.1 ± 0.2

EXAMPLE 3

Several single sided circuit boards were coated with activated rosin flux and soldered by passing the boards over a preheater, to obtain top side board temperatures of approximately 200° F. (93° C.), and then through 500° F. (260° C.) molten solder. The soldered boards were defluxed separately, with the azeotropic mixtures cited in Examples 1 and 2 above, by suspending a circuit board, first, for three minutes in the boiling sump, which contained the azeotropic mixture, then, for one minute in the rinse sump, which contained the same azeotropic mixture, and finally, for one minute in the solvent vapor above the boiling sump. The boards cleaned in each azeotropic mixture had no visible residue remaining thereon.

EXAMPLE 4

Preparation of $CF_3CF=CF_2CF_3$ (F-Pentene-2)

A 400-mL metal tube charged at $-20°$ C. with 8.0 g of $AlF_{2.8}Cl_{0.2}$ (prepared from $AlCl_3$), 75 g (0.50 mol) of hexafluoropropene, and 50 g (0.50 mol) of tetrafluoroethylene was shaken for 30 min. while the temperature rose quickly to 20° C. and the pressure dropped to 8 psi. Distillation of the product afforded 88.0 g (70%) of F-pentene-2, b.p. 23°-26° C., identified by IR, NMR and GC/MS. NMR showed the product to be 89% trans-isomer and 11% cis-isomer.

EXAMPLE 5

Vapor Phase Reduction of $CF_3CF=CFCF_2CF_3$

A 6" × ¼" O. D. Hastelloy tube was charged with 10.0 g of 0.5% palladium on 5×8 mesh alumina spheres. This was a commercial sample from Calsicat which was reduced with hydrogen prior to use. Co-fed to the reactor were vaporized perfluoropentene-2 (2 mL/hr as liquid) and hydrogen (20 mL/min). Product stream leaving the reactor was analyzed by on-line GC and on-line MS, the product then being collected in a $-80°$ C. trap during the run. At temperatures of 100°-200° C., conversions were 96-99% with yields of perfluoro-2H,3H-pentane consistently 95% or better over the temperature range. The level of trihydro by-product was about 1%. Product, bp 50-55% ° C., easily obtained pure by a simple fractionation, was shown by GC and NMR analyses to have a ratio of diastereomers of about 90:10.

EXAMPLE 6

Reduction of $CF_3CF=CFCF_2CF_3$

Reduction of 22.7 g (0.091 mol) of perfluoropentene-2 with 2.0 g of 5% Pd on carbon in 100 mL of toluene was carried out at 25° C. under ca. 20–50 psi of hydrogen until hydrogen absorption fell to 0.3 psi/hour. Distillation served to isolate volatiles, bp 25°–62° C., 18.3 g, which contained 65 wt-% of pentanes composed of 94:6 mol-ratio of dihydro- to trihydropentanes. The perfluoro-2H,3H-pentane consisted of diastereomers in a 97:3 ration, an especially high selectivity.

This reaction demonstrated the unusually high selectivity for dihydrogenation of a perfluorinated linear internal olefin and, in addition, striking selectivity for formation of only one diastereomeric dihydro product, when the metal-catalyzed reduction is carried out in nonpolar medium.

I claim:

1. An azeotropic composition consisting essentially of:
   (a) 55–65 weight percent 1,1,1,2,3,4,4,5,5,5-decafluoropentane, 32.5–40 weight percent trans 1,2-dichloroethylene, and 2.5–5 weight percent methanol, wherein the composition has a boiling point of about 35.3° C. when the pressure is adjusted to substantially atmospheric pressure; or
   (b) 59–67 weight percent 1,1,1,2,3,4,4,5,5,5-decafluoropentane, 31.5–38 weight percent trans 1,2-dichloroethylene, and about 0.5–3 weight percent ethanol, wherein the composition has a boiling point of about 35.1° C. when the pressure is adjusted to substantially atmospheric pressure.

2. The azeotropic composition of claim 1, consisting essentially of about 55–65 weight percent 1,1,1,2,3,4,4,5,5,5-decafluoropentane, about 32.5–40 weight percent trans 1,2-dichloroethylene and about 2.5–5 weight percent methanol.

3. The azeotropic composition of claim 2 consisting essentially of 58–64 weight percent 1,1,1,2,3,4,4,5,5,5-decafluoropentane, 34–38 weight percent trans 1,2-dichloroethylene and 3–4 weight percent methanol.

4. The azeotropic composition of claim 3, consisting essentially of about 60.5 weight percent 1,1,1,2,3,4,4,5,5,5-decafluoropentane, about 36.2 weight percent trans 1,2-dichloroethylene and about 3.3 weight percent methanol.

5. The azeotropic composition of claim 1, consisting essentially of about 59–67 weight percent 1,1,1,2,3,4,4,5,5,5-decafluoropentane, about 31.5–38 weight percent trans 1,2-dichloroethylene and about 0.5–3 weight percent ethanol.

6. The azeotropic composition of claim 5 consisting essentially of 61–66 weight percent 1,1,1,2,3,4,4,5,5,5-decafluoropentane, 33.5–37 weight percent trans 1,2-dichloroethylene and 0.5–2 weight percent ethanol.

7. The azeotropic composition of claim 6, consisting essentially of about 64 weight percent 1,1,1,2,3,4,4,5,5,5-decafluoropentane, about 35.0 weight percent trans 1,2-dichloroethylene and about 1.0 weight percent ethanol.

8. A process for producing a refrigeration which comprises evaporating a mixture of claim 1 in the vicinity of a body to be cooled.

9. A process for producing heat which comprises condensing a composition of claim 1 in the vicinity of a body to be heated.

10. In a process for preparing a polymer foam comprising expanding a polymer with a blowing agent, the improvement wherein the blowing agent is a composition of claim 1.

11. In an aerosol composition comprising a propellant and an active agent, the improvement wherein the propellant is a composition of claim 1.

12. A process for preparing aerosol formulations comprising condensing an active ingredient in an aerosol container with an effective amount of the composition of claim 1 as a propellant.

13. A process for cleaning a solid surface which comprises treating said surface with the azeotrope or azeotrope-like compositions of claim 1.

14. The process of claim 12, wherein the solid surface is a printed circuit board contaminated with flux and flux-residues.

15. The process of claim 13, wherein the solid surface is a metal.

* * * * *